United States Patent
O'Connell et al.

(10) Patent No.: US 8,669,787 B2
(45) Date of Patent: Mar. 11, 2014

(54) ZERO-CROSSING DETECTOR FOR INDUSTRIAL CONTROL WITH LOW HEAT DISSIPATION

(75) Inventors: John O'Connell, Painesville, OH (US); Dale Terdan, Concord Township, OH (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

(21) Appl. No.: 13/474,348

(22) Filed: May 17, 2012

(65) Prior Publication Data

US 2013/0307586 A1    Nov. 21, 2013

(51) Int. Cl.
*H03K 5/22* (2006.01)

(52) U.S. Cl.
USPC .......................................................... 327/79

(58) Field of Classification Search
USPC ..................... 327/78, 79, 108, 478, 482, 544
See application file for complete search history.

(56) References Cited

U.S. PATENT DOCUMENTS

| | | | | |
|---|---|---|---|---|
| 3,693,027 A * | 9/1972 | Garaway | ............................ | 361/5 |
| 5,253,140 A * | 10/1993 | Inoue et al. | ................... | 361/728 |
| 6,662,247 B1 * | 12/2003 | Ales et al. | ........................ | 710/52 |
| 7,508,240 B1 * | 3/2009 | Yurick et al. | ..................... | 327/79 |
| 7,941,229 B2 * | 5/2011 | Hildebran | ........................... | 700/2 |
| 7,973,562 B1 * | 7/2011 | Zhang et al. | .................... | 326/83 |
| 8,248,109 B2 * | 8/2012 | Scholder | ......................... | 327/78 |
| 2008/0309379 A1 * | 12/2008 | Carroll | ............................ | 327/79 |

* cited by examiner

*Primary Examiner* — Nguyen Tran
*Assistant Examiner* — Afework Demisse
(74) *Attorney, Agent, or Firm* — Scott Speroff; Boyle Fredrickson, S.C.; John M. Miller

(57) ABSTRACT

An I/O circuit for use with an industrial controller provides a zero-crossing detector circuit with low power dissipation through the use of a zero-crossing circuit that activates a light emitting diode of a photo coupler only for a very brief period of time at the zero-crossing (as opposed to at all times other than the zero-crossing). The circuit is coupled with a power supply circuit that uses a reactive element for voltage dropping as opposed to a resistive voltage drop element further reducing power consumption possible with the low power consumption of the photo coupler.

12 Claims, 3 Drawing Sheets

US 8,669,787 B2

1

ZERO-CROSSING DETECTOR FOR INDUSTRIAL CONTROL WITH LOW HEAT DISSIPATION

BACKGROUND OF THE INVENTION

The present invention relates to I/O modules for industrial control systems and in particular to a low heat dissipation I/O module that may flexibly accommodate the digital control of AC power with zero-crossing detection.

Industrial controllers are specialized computer systems used for the control of industrial processes or machinery, for example, in a factory environment. Industrial controllers differ from conventional computers in a number of ways. Physically, they are constructed to be substantially more robust against shock and damage and to better resist external contaminants and extreme environmental conditions. The processors and operating systems are optimized for real-time control and execute languages allowing ready customization of programs to comport with a variety of different controller applications. Typically, the controllers have a highly modular architecture that allows different numbers and types of input and output modules to be used to connect the controllers to the process or machinery to be controlled. This modularity is facilitated through the use of special "control networks" suitable for highly reliable and available real-time communication. Such control networks (for example, Ethernet IP) differ from standard communication networks (e.g. Ethernet) by guaranteeing maximum communication delays, for example, as obtained by pre-scheduling the bandwidth of the network, and/or providing redundant communication capabilities to high-availability.

As part of their enhanced modularity, industrial controllers may employ I/O modules dedicated to a particular type electrical signal and function, for example, detecting input AC or DC signals or controlling output AC or DC signals. Each of these I/O modules may have a connector system allowing them to be installed in different combinations in a housing or unit along with other selected I/O modules to match the demands of the particular application. Multiple units may be located at convenient control points near the controlled process or machine to communicate with a central industrial controller via a special control network such as Ethernet IP.

Normally different I/O modules are required for the control of AC and DC signals reflecting differences in the control devices used for the signals (e.g. triacs versus transistors). Different I/O DC modules may be required depending on whether the DC signal is "sourced" from the DC output module or "sinked" into the DC output module.

The circuitry of the I/O module communicating with the industrial controller (controller-side) is typically optically isolated from the circuitry communicating with the controlled process or machine (field-side) in order to prevent faults in the field-side from damaging the industrial control system or other I/O modules. For output circuits (such as AC output or DC output circuits) it can be necessary to provide a source of low voltage DC for operation of the field-side circuitry independent of the power available on the controller-side. Often this is done through the use of a voltage dropping resistance converting the high voltages controlled by the I/O module into a lower voltage suitable for powering the field-side circuitry. Such voltage dropping resistors are often physically large to handle the necessary power dissipation and must be spaced apart to aid in dissipating the incident heat.

The control of AC voltages is often provided by a triac or thyristor that may be switched at a zero-crossing of the AC signal (to reduce electrical switching noise and power dissipation) by a conventional trigger circuit relying on a phase shifted version of the AC signal being controlled.

SUMMARY OF THE INVENTION

The present invention provides a zero-crossing detector for use with an I/O module providing phase control of AC signals, the zero-crossing detector having substantially reduced power dissipation. A transistor circuit provides for activation of an optical isolator for only a brief period of time near the zero-crossing of the AC waveform, substantially reducing the power dissipated by this relatively high current element. Reduced current demand allows an impedance (rather than resistance) limited power source avoiding the power dissipation attendant to voltage dropping resistors normally used to moderate the voltage of the AC waveform for use by the transistor circuitry. Reduced power dissipation allows significantly smaller components with closer spacing for more compact I/O module.

More specifically, one embodiment of the present invention provides an I/O module circuit for use in an industrial control system providing a housing with terminals supported by the housing for receipt of electrical power to be controlled by the I/O module circuit. A circuit contained in the housing provides a transistor switch element having an input connected to a terminal for receiving an AC waveform therefrom and having an output providing a zero-crossing signal indicating a voltage of the AC waveform within a first and second predetermined voltage threshold near zero voltage of the AC waveform. An optical isolator having a light emitting diode is connected to the transistor switch element to switch on and off according to the zero-crossing signal and having a photosensitive solid-state switch receiving light from the LED to provide an optically isolated zero-crossing signal wherein the zero-crossing signal from the transistor switch element provides conduction of the LED only during times when the AC waveform is between the first and second voltage threshold.

It is thus a feature of at least one embodiment of the invention to provide the conduction of the LED for a small fraction of the AC cycle thereby substantially conserving electrical power.

The transistor switch element may provide a duty cycle of less than five percent for AC waveforms in the range of 120 volts AC to 240 volts AC.

It is thus a feature of at least one embodiment of the invention to provide a more compact I/O circuit by limiting the need for heat dissipation over a range of expected voltages.

The transistor switch element may include a first transistor that conducts when the AC waveform is above a first threshold and a second transistor that conducts when the AC waveform is below the second threshold and a third transistor communicating with the first and second transistors to conduct only when neither the first or second transistor is conducting.

It is thus a feature of at least one embodiment of the invention to provide a relatively simple circuit for defining a narrow range near zero voltage for AC zero voltage detection such as normally might require more complex voltage comparator circuits.

The first transistor may be an NPN transistor having a base connected to the AC waveform and the second transistor may be a PNP transistor having a base connected to the AC waveform and wherein the NPN transistor and PNP transistor are connected in parallel to each other and in series with a resistance to a voltage provided by the power circuit and wherein the junction between the resistance and the parallel connected NPN and PNP transistors is connected to the base of the third transistor which controls current through the LED of the optical isolator.

It is thus a feature of at least one embodiment of the invention to make use of the intrinsic turn on characteristics of bipolar transistors to provide a low voltage detection threshold. It is a further feature of at least one embodiment of the invention to make use of NPN and PNP transistors to provide for the necessary two different thresholds defining a range near zero voltage.

The transistor switch element may be connected directly to the AC waveform through a resistance without rectification.

It is thus a feature of at least one embodiment of the invention to eliminate the need for a rectifier bridge or the like to define multiple voltage thresholds, for example, by a full wave rectifier followed with a single threshold detector.

The I/O module circuit may further include a microprocessor for receiving the optically isolated zero-crossing signal and a switch element receiving a control signal from the microprocessor to control a switching of the AC waveform across the terminals.

It is thus a feature of at least one embodiment of the invention to make use of the microprocessor circuitry normally found in an I/O module to replace the phase delay circuitry often used for triac control.

The microprocessor may provide a switch signal at a predetermined phase delay with respect to isolated zero-crossing signal according to a phase control signal received by the microprocessor It is thus a feature of at least one embodiment of the invention to provide for flexible AC control not limited to zero-crossing control.

The I/O module circuit may further include a power circuit receiving the AC waveform to rectify the AC waveform to provide power to the transistor switch element.

It is thus a feature of at least one embodiment of the invention to provide power to the necessary zero-crossing detection circuitry from the AC waveform being controlled.

The power receiving circuit may include a series connected nonresistance impedance limiting current to the power circuit.

It is thus a feature of at least one embodiment of the invention to eliminate power dissipation inherent in resistive voltage dropping systems.

These particular objects and advantages may apply to only some embodiments falling within the claims and thus do not define the scope of the invention.

DETAILED DESCRIPTION OF THE PREFERRED EMBODIMENT

Figure 1:
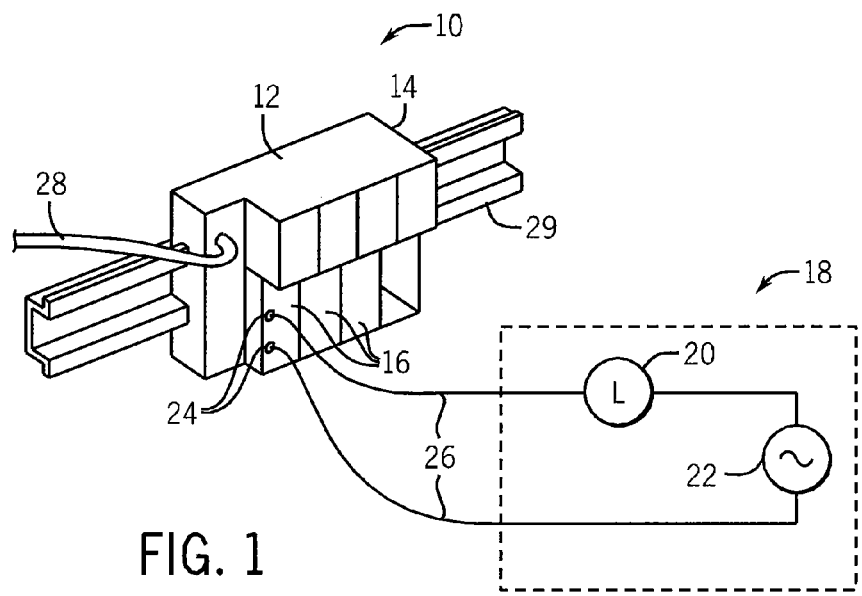
FIG. 1 is a perspective view of a remote I/O unit of a type suitable for use with the present invention showing a housing having multiple I/O modules contained therein for communication with an industrial process via terminals and a remote industrial controller via a network cable.
Figure 2:
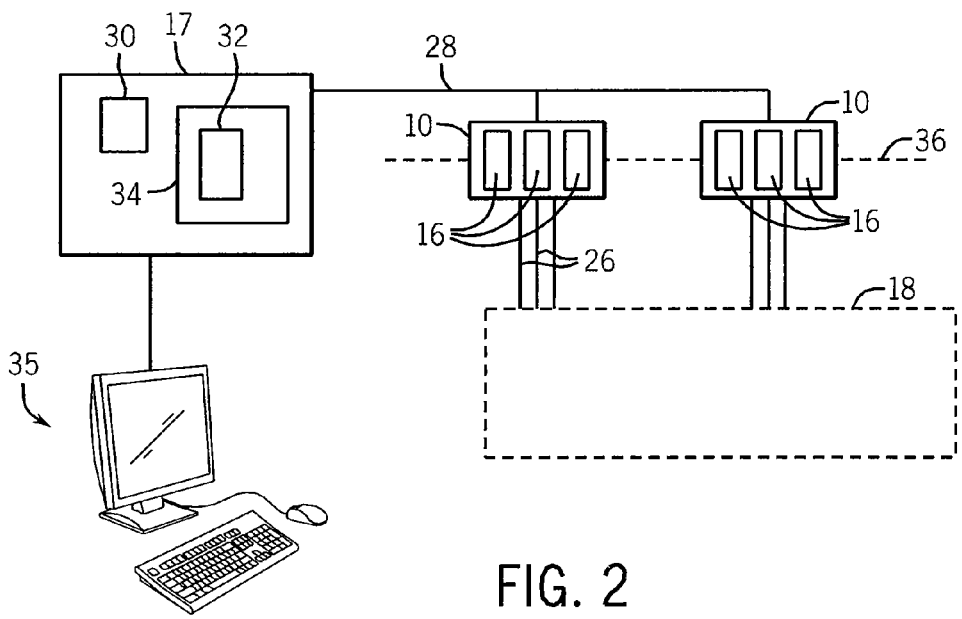
FIG. 2 is a block diagram showing the I/O unit of FIG. 1 in the context of the industrial control system incorporating multiple remote I/O units and an industrial controller.

Referring now to FIGS. 1 and 2, an I/O block 10 may provide for a unit housing 12 having multiple openings 14 for orienting and supporting corresponding replaceable or permanently installed I/O modules 16. The I/O modules 16 generally provide an electrical interface between an industrial controller 17 and an industrial process or machine 18, the latter having actuators presenting loads 20 as powered by external field-side power sources 22 which may be AC sources (as shown) or DC sources as will be described. Each of the I/O modules 16 may have exposed screw terminals 24 for connecting circuitry of the I/O module 16 via electrical conductors 26 to the load 20 and field-side power source 22 of the industrial process or machine 18.

The housing 12 of the I/O block 10 may be supported, for example, on a DIN rail 29 of a type known in the art or may provide for another mounting arrangement allowing it to be located close to the desired controlled loads 20. The I/O block 10 may connect via a control network 28, for example ControlNet or Ethernet IP, to industrial controller 17 for communication of control data between the I/O modules 16 of the I/O block 10 and the industrial controller 17.

Generally, the industrial controller 17 will include at least one processor 30 executing a stored control program 32 contained in a communicating memory 34 to provide for communication with the control network 28 to exchange signals with the I/O block 10 for control of the industrial process or machine 18 according to a stored control program 32. The stored control program 32 reads signals indicating the state of the industrial process or machine 18 (from sensors or the like) and writes outputs to the I/O block 10 to control the loads 20 according to those sensed inputs and the logic of the control program 32. The industrial controller 17 may include a connection to a user interface terminal 35 (for example including a display, computer, keyboard, and mouse or the like) allowing programming and other control of the industrial controller 17 and providing for output of information to an operator. Industrial controllers 17 suitable for use with the present invention include, for example, programmable controllers commercially available from Rockwell Automation, Inc.

Generally, the I/O modules 16 of each I/O block 10 include an electrical isolation barrier 36 between the electrical power and circuitry of the industrial process or machine 18 and directly connected portions of the I/O module 16, and the circuitry of the industrial control system including the industrial controller 17, the network 28, the I/O blocks 10 and remaining portions of the I/O modules 16. Electrical isolation, as understood herein, refers to the portions of an electrical circuit and do not communicate by a DC electric path within the I/O block 10. Circuitry on the side of the electrical isolation barrier 36 toward the industrial process or machine 18 will be termed "field-side" circuitry and circuitry on the side of the electrical isolation towards the industrial controller 17 will be termed "controller-side" circuitry. Electrical isolation, as is understood in the art, may be accomplished by an optical isolator or transformer that prevents DC conduction through the electrical isolation barrier 36 to prevent damage to the controller-side circuitry in the event of fault on the field-side circuitry. This isolation prevents simple sharing of electrical power between the circuits on the controller-side in the field-side by conductors spanning the isolation barrier 36.

Figure 3:
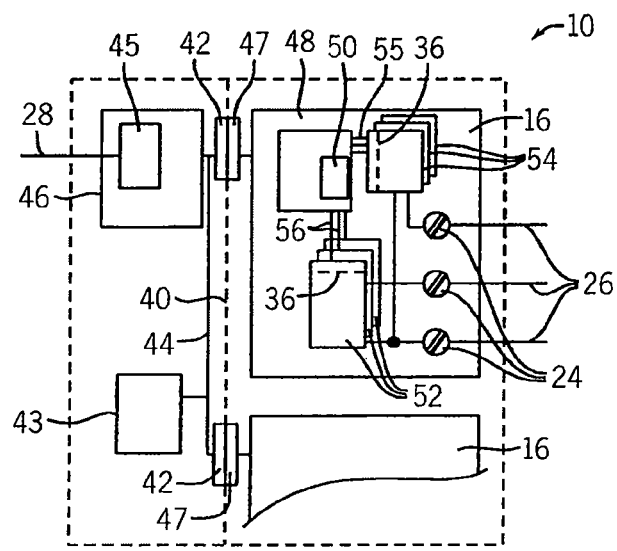
FIG. 3 is a block diagram of the remote I/O unit showing connectors for attaching I/O modules installed in the I/O unit to a common bus communicating with the network cable and electrical power, and showing one I/O module providing a power control circuit and a zero-crossing circuit controlled by a micro-controller.

Referring now to FIG. 3, each I/O block 10 may provide a backplane 40 providing a set of electrically releasable or permanently connected electrical connectors 42 communicating with a backplane bus 44 providing parallel or serial digital communication and electrical power. Electrical power may be provided by a power supply 43. The digital communication on the backplane bus 44 may be moderated by a unit controller 46 including network circuit 45 communicating with the industrial control network 28. The unit controller 46 and network circuit 45 may be, for example, one or more electronic processors executing a stored program stored in memory or the like.

The electrical connectors 42 forming the backplane bus 44 may connect with corresponding electrical connectors 47 positioned at the rear of each I/O module 16 allowing electrical connection between controller-side circuitry of the I/O block 10 and the controller-side circuitry of the I/O module 16 for directly communicating data and power therebetween when an I/O module 16 is inserted into the I/O block 10. Within each I/O module 16, a module controller 48, for example a microcontroller, may execute a stored program 50 to coordinate functions of the I/O module 16 by communicating with multiple output circuits 52 and corresponding multiple zero-crossing detector circuits 54. Each of these output circuits 52 and zero-crossing detector circuits 54 may provide internally for an electrical isolation barrier 36 between controller-side and field-side circuitry as will be described. Each of these output circuits 52 and zero-crossing detector circuits 54 also communicate with a shared set of terminals 24 (only three shown for clarity) that may, for example, be screw type terminals releasably receiving electrical conductors 26.

As will be understood in the art, the zero-crossing detector circuit 54 provides a detection of zero-crossing of the waveform applied to the terminals 24 connected across an AC power line (the outer two terminals 24 as depicted) to produce a zero-crossing signal 55 transmitted to the module controller 48 and indicating the timing of the zero-crossing of AC waveform on the terminals 24.

The module controller 48 receiving this zero-crossing signal 55 provides a switch state signal 56 for each output circuit 52 indicating a desired control of electrical power at an output terminal 24 (the center terminal 24 as depicted) based on the switch state signal 56. In one mode of operation, conduction between output terminal 24 and one other terminal 24 is changed by output circuit 52 via the switch state signal 56 either by opening or closing the circuit between output terminals 24 and a line terminal 24 only at the zero-crossings of the AC waveform to: (1) reduce power dissipation in the internal switching elements used to control power conducted through the output terminals 24, (2) accommodate the architecture of the switching element characteristics (for example when a triac is used), and/or (3) reduce the generation of electromagnetic interference.

Alternatively, in a different mode of operation, the module controller 48 may receive a switch command signal, for example, from the backplane 40 as communicated from the controller 17, commanding a switching of conduction between terminals 24' and 24 at times other than zero-crossings of the AC waveform, for example, to provide for duty cycle control of the AC waveform. This latter mode of operation may control, for example, average current for a resistive heating element more precisely or may be used to deal with reactive loads. This phase offset control of the switching with respect to the zero-crossing signal may be implemented by appropriate instructions in the stored program 50.

Figure 4:
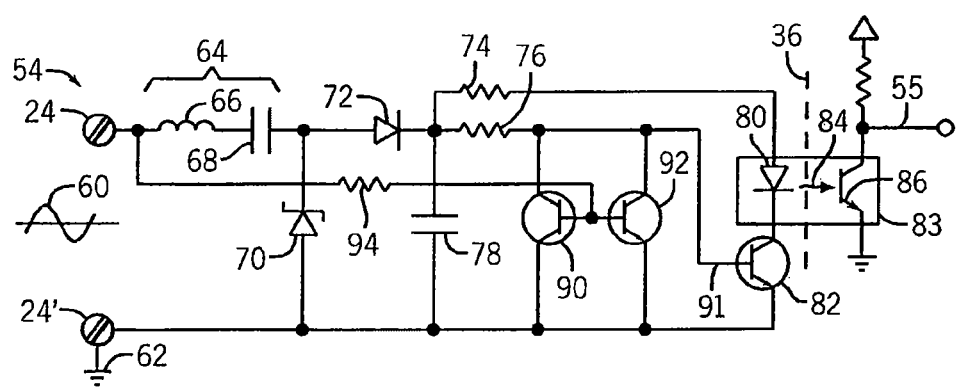
FIG. 4 is a detailed schematic of the zero-crossing circuit of FIG. 3 such as may receive an AC waveform from the output terminals to provide an isolated signal through an optical isolator.

Referring now to FIG. 4, the zero-crossing detector circuit 54 may receive an AC waveform 60 across the terminals 24, for example a ground reference 62 at one terminal 24' and the AC waveform at terminal 24. The AC waveform will, in one embodiment, be at approximately 60 Hz and have a voltage between 120 and 240 volts AC.

The terminal 24 receiving the AC waveform may connect to an impedance element 64 comprising a series connected inductor 66 and capacitor 68 which in turn connects to the cathode of the zener diode 70 having its opposite terminal connected to ground 62.

The zener diode 70 may have a relatively low zero zener voltage (e.g. five volts) providing a voltage drop across the impedance element 64 of substantially the entire voltage of the AC waveform 60 when the zener diode 70 is conducting. For this reason, impedance element 64 must be sized to provide this necessary voltage drop and to limit current flow through the zener diode 72 and the acceptable value for that component, typically a few hundred milliamps or less. It will be understood that a reactive impedance element 64 may block current flow without dissipating substantial energy in contrast to a blocking resistance so that substantially no heat is generated in this current limiting process.

The junction between the impedance element 64 and the zener diode 70, being at the low zener regulated voltage, may connect to the anode of a rectifying diode 72 whose cathode connects to a filter capacitor 78, the latter connected between the cathode and ground. The combination of the rectifier 72 and the filter capacitor 78 provide at their junction a source of regulated DC power to resistor 74 and resistor 76, both connected to that junction.

Resistor 74 passes to the anode of a light emitting diode (LED) 80 being part of an optical isolator 83. The cathode of the LED 80 connects in turn with the collector of an NPN switching transistor 82 whose emitter is connected to ground 62. When the switching transistor 82 is turned on, the LED 80 is illuminated providing optical signal 84 to phototransistor 86 of the optical isolator 83 finding the isolation barrier 36. The phototransistor 86 may be output as the zero-crossing signal 55, as described above, leading to module controller 48 shown in FIG. 3.

Resistor 76, described above and also connected to the source of regulated DC power at the junction of rectifier 72 and filter capacitor 78, provides regulated DC power to the emitter of a first PNP transistor 90 and a collector of a second NPN transistor 92. The collector of PNP transistor 90 and the emitter of NPN transistor 92 are both connected to ground and the bases of the transistors 90 and 92 are joined to a high impedance resistance 94, the other end of which is attached to the terminal 24 receiving the AC waveform 60. This resistance 94 provides a trigger signal that is in phase with the AC waveform 60, avoiding the phase shift of the impedance element 64.

The emitter of PNP transistor 90 and collector of NPN transistor 92 also join with the base of switching transistor 82 to provide a base voltage 91 such that switching transistor 82 will turn on (conduct current between its collector and emitter) only when both transistors 90 and 92 are turned off (block current between collector and emitter) and will conversely be turned off when either of transistors 90 and 92 are turned on. It will be further understood that when the PNP transistor 90 and NPN transistor 92 are turned off, the emitter of PNP transistor 90 and collector of NPN transistor 92 will be retained at substantially 0.7 volts being the base to emitter forward bias voltage of transistor 82 when both of transistors 90 and 92 are off.

Figure 5:
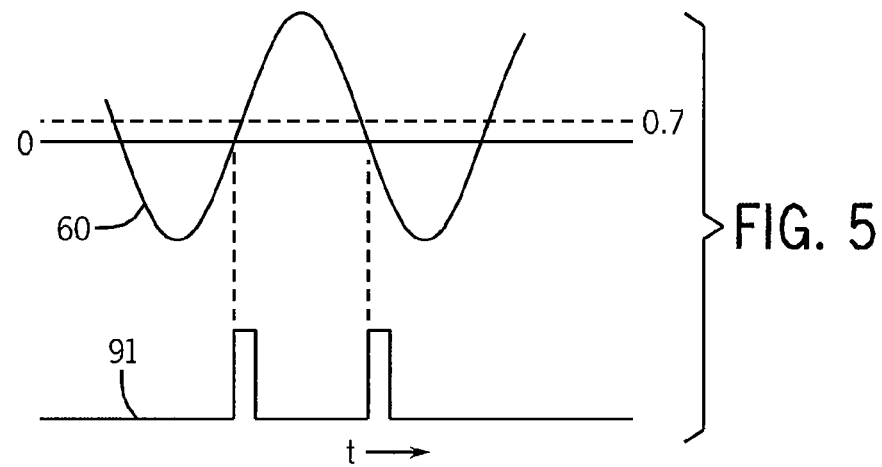
FIG. 5 is aligned graphs showing the AC waveform and the switching of the LED of the optical isolator for a short period of time only near the zero-crossing of the AC waveform.
Figure 6:
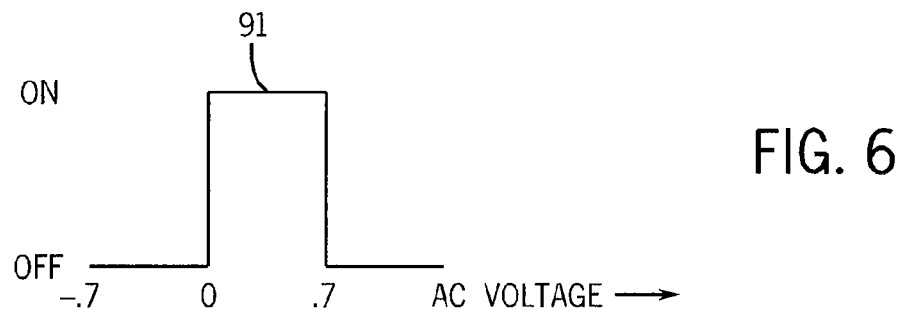
FIG. 6 is a plot of the state of switching of the LED of the optical isolator versus AC waveform voltage for the circuit of FIG. 4.

Referring now also to FIGS. 5 and 6, when the AC waveform 60 connected between terminals 24 and 24' is at a voltage below zero volts, PNP transistor 90 will be turned on pulling the base voltage 91 of switching transistor 82 to a low-voltage turning the switching transistor 82 off and stopping conduction of current through the LED 80.

When the AC waveform 60 is between approximately zero and 0.7 volts, PNP transistor 90 will turn off and NPN transistor 92 will likewise be turned off again for lack of sufficient forward biasing of its emitter junction. At this time, the base voltage 91 of transistor 82 rises sufficiently to turn on switching transistor 82 and LED 80.

When the AC waveform 60 rises above approximately 0.7 volts, PNP transistor 90 has its emitter back-biased and turns off but the emitter of NPN transistor 92 is forward biased to turn on, again pulling base voltage 91 close to ground by the saturation voltage of NPN transistor 92 and turning off switching transistor 82.

Accordingly it will be understood that the switching transistor 82 and the LED 80 are off for most of the cycle of the AC waveform substantially conserving power. Typically the duty cycle of the base voltage 91 and hence of the LED 80 will be less than 10 percent and more typically much less than one percent of the period of the AC waveform 60. This reduced duty cycle provides less current drain of the power source provided by the impedance element 64, rectifier 72, and filter capacitor 78 allowing these components to be comparably smaller and permitting a low current zener diode 70 to be used.

Figure 7:
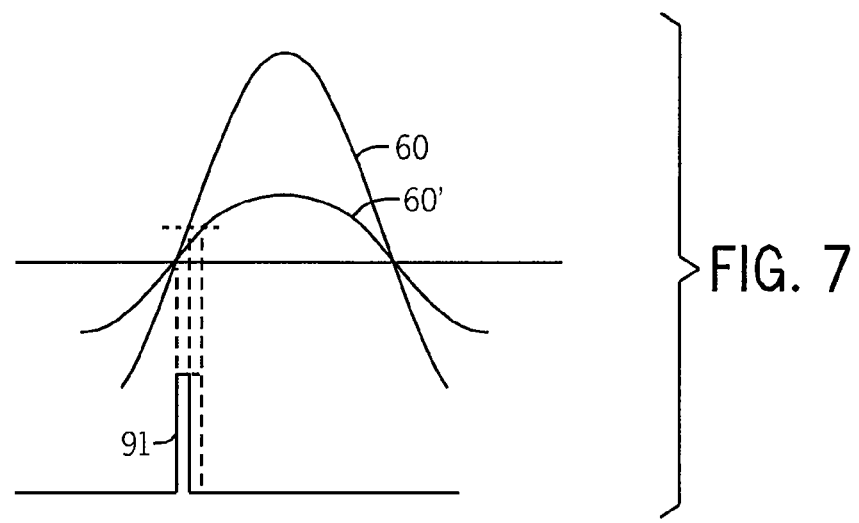
FIG. 7 is aligned graphs showing a change in the width of the pulse of FIG. 6 with different amplitudes of AC waveforms allowing indirect amplitude monitoring.

Referring now to FIG. 7, it will be understood that the width of the pulse of waveform 91 and hence of the output zero-crossing signal 55 can be used to determine a coarse voltage level of the AC waveform 60 within AC waveform. For example, when the AC waveform 60 is 240 volts, the zero-crossing will be steeper resulting in a relatively narrow pulse 91 measured in absolute time. Conversely, when the AC waveform 60' is a relatively lower voltage, for example 120 volts, the zero-crossing will be slower extending the pulse of base voltage 90'. In this way, operation of the I/O module at 120 or 240 volts may be determined and other simple voltage measurements may be made.

Certain terminology is used herein for purposes of reference only, and thus is not intended to be limiting. For example, terms such as "upper", "lower", "above", and "below" refer to directions in the drawings to which reference is made. Terms such as "front", "back", "rear", "bottom" and "side", describe the orientation of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first", "second" and other such numerical terms referring to structures do not imply a sequence or order unless clearly indicated by the context.

When introducing elements or features of the present disclosure and the exemplary embodiments, the articles "a", "an", "the" and "said" are intended to mean that there are one or more of such elements or features. The terms "comprising", "including" and "having" are intended to be inclusive and mean that there may be additional elements or features other than those specifically noted. It is further to be understood that the method steps, processes, and operations described herein are not to be construed as necessarily requiring their performance in the particular order discussed or illustrated, unless specifically identified as an order of performance. It is also to be understood that additional or alternative steps may be employed.

References to "a microprocessor" and "a processor" or "the microprocessor" and "the processor," can be understood to include one or more microprocessors that can communicate in a stand-alone and/or a distributed environment(s), and can thus be configured to communicate via wired or wireless communications with other processors, where such one or more processor can be configured to operate on one or more processor-controlled devices that can be similar or different devices. Furthermore, references to memory, unless otherwise specified, can include one or more processor-readable and accessible memory elements and/or components that can be internal to the processor-controlled device, external to the processor-controlled device, and can be accessed via a wired or wireless network.

Co-pending patent applications entitled Input Circuit For Industrial Control With Low Heat Dissipation Ser. No. 13/474,351 and Output Module For Industrial Control With Sink And Source Capability And Low Heat Dissipation Ser. No. 13/473,711 filed on even date herewith and assigned to the same assignee as the present invention are hereby incorporated by reference in their entirety.

It is specifically intended that the present invention not be limited to the embodiments and illustrations contained herein and the claims should be understood to include modified forms of those embodiments including portions of the embodiments and combinations of elements of different embodiments as come within the scope of the following claims. All of the publications described herein, including patents and non-patent publications are hereby incorporated herein by reference in their entireties.

What we claim is:

1. An I/O module circuit for use in an industrial control system comprising:
    a housing;
    terminals supported by the housing for receipt of electrical power to be controlled by the I/O module circuit; and
    a circuit contained in the housing providing:
    a transistor switch element having an input connected to a terminal for receiving an AC waveform therefrom and having an output providing a zero-crossing signal indicating a voltage of the AC waveform within a first and second predetermined voltage threshold near zero voltage of the AC waveform;
    an optical isolator including a light emitting diode (LED) connected to the transistor switch element to switch on and off according to the zero-crossing signal and having a photosensitive solid-state switch receiving light from the LED to provide an optically isolated zero-crossing signal;
    wherein the zero-crossing signal from the transistor switch element provides conduction of the LED only during times when the AC waveform is between the first and second voltage threshold;
    wherein the transistor switch element provides a duty cycle of less than five percent for AC waveforms in a range of 120 volts AC to 240 volts AC;
    wherein the transistor switch element includes a first transistor that conducts when the AC waveform is above a first threshold and a second transistor that conducts when the AC waveform is below the second threshold and a third transistor communicating with the first and second transistors to conduct only when neither the first or second transistor is conducting.

2. The I/O module circuit of claim 1 wherein the first transistor is an NPN transistor having a base connected to the AC waveform and the second transistor is a PNP transistor having a base connected to the AC waveform and wherein the NPN transistor and PNP transistor are connected in parallel to each other and in series with a resistance to a voltage provided by the power circuit and wherein the junction between the resistance and the parallel connected NPN and PNP transistors is connected to the base of the third transistor which controls current through the LED of the optical isolator.

3. The I/O module circuit of claim 1 wherein the transistor switch element is connected directly to the AC waveform through a resistance without rectification.

4. The I/O module circuit of claim 1 further including a microprocessor for receiving the optically isolated zero-crossing signal and a switch element receiving a control signal from the microprocessor to control a switching of the AC waveform across the terminals.

5. The I/O module circuit of claim 4 wherein the microprocessor provides a switch signal at a predetermined phase delay with respect to an isolated zero-crossing signal according to a phase control signal received by the microprocessor.

6. The I/O module circuit of claim 1 further including a power circuit receiving the AC waveform to rectify the AC waveform to provide power to the transistor switch element.

7. The I/O module circuit of claim 1 wherein the power receiving circuit includes a series connected nonresistance impedance limiting current to the power circuit.

8. The I/O module circuit of claim 1 wherein the terminals are screw type terminals.

9. The I/O module circuit of claim 1 further including a unit having multiple unit releasable electrical connectors, the units supporting multiple I/O module circuits each having releasable electrical connectors connecting with the unit releasable electrical connectors, the unit releasable electrical connectors further communicating with a network communication circuit for receiving the signal indicating a desired control of electrical power at the terminals of the I/O module from a remote industrial controller; wherein the unit includes elements for orienting and supporting the I/O module in the unit.

10. An industrial control system comprising:
an industrial controller having at least one processor executing a stored program to receive input signals reflecting a state of a connected industrial process and to provide output signals providing desired control of the state of the connected industrial process;
a network providing a protocol ensuring a guaranteed maximum delay in a communication of data on the network system communicating with the industrial controller to communicate input and output signals therewith;
an I/O module communicating with the network system to exchange the input and output signals therewith, the I/O module further comprising:
a housing;
terminals supported by the housing for receipt of electrical power to be controlled by the I/O module circuit; and
a circuit contained in the housing providing:
a transistor switch element having an input connected to a terminal for receiving an AC waveform therefrom, detecting a first and second predetermined voltage threshold near zero voltage of the AC waveform, and having an output providing a zero-crossing signal indicating a each time voltage of the AC waveform is within the first and second redetermined voltage threshold near zero voltage of the AC waveform;
an optical isolator including a light emitting diode switched on and off according to the zero-crossing signal and having a photosensitive solid-state switch receiving light from the LED to provide an optically isolated zero-crossing signal;
wherein the zero-crossing signal from the transistor switch element provides conduction of the LED only during times when the AC waveform is between the first and second voltage threshold;
wherein the transistor switch element provides a duty cycle of less than five percent for AC waveforms in the range of 120 volts AC to 240 volts AC; and
wherein the transistor switch element includes a first transistor that conducts when the AC waveform is above a first threshold and a second transistor that conducts when the AC waveform is below the second threshold and a third transistor communicating with the first and second transistors to conduct only when neither the first or second transistor is conducting.

11. The industrial control system of claim 10 wherein the first transistor is an NPN transistor having a base connected to the AC waveform and the second transistor is a PNP transistor having a base connected to the AC waveform and wherein the NPN transistor and PNP transistor are connected in parallel to each other and in series with a resistance to a voltage provided by the power circuit and wherein the junction between the resistance and the parallel connected NPN and PNP transistors is connected to the base of the third transistor which controls current through the LED of the optical isolator.

12. The I/O module circuit of claim 10 further including a microprocessor for receiving the optically isolated zero-crossing signal and a switch element receiving a control signal from the microprocessor to control a switching of the AC waveform across the terminals;
wherein the microprocessor provides a switch signal at a predetermined phase delay with respect to an isolated zero-crossing signal according to a phase control signal received by the microprocessor.

* * * * *

UNITED STATES PATENT AND TRADEMARK OFFICE
CERTIFICATE OF CORRECTION

| | | |
|---|---|---|
| PATENT NO. | : 8,669,787 B2 | Page 1 of 1 |
| APPLICATION NO. | : 13/474348 | |
| DATED | : March 11, 2014 | |
| INVENTOR(S) | : O'Connell et al. | |

It is certified that error appears in the above-identified patent and that said Letters Patent is hereby corrected as shown below:

IN THE CLAIMS

CLAIM 10       Delete "redetermined" and substitute therefor
Col. 10, Line 14       -- predetermined --

Signed and Sealed this
Seventh Day of October, 2014

Michelle K. Lee
*Deputy Director of the United States Patent and Trademark Office*